United States Patent
Zhang

(10) Patent No.: US 9,136,473 B2
(45) Date of Patent: Sep. 15, 2015

(54) SEMICONDUCTOR DEVICE WITH PCM MEMORY CELLS AND NANOTUBES AND RELATED METHODS

(71) Applicant: STMICROELECTRONICS, INC., Coppell, TX (US)

(72) Inventor: John H. Zhang, Fishkill, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 113 days.

(21) Appl. No.: 13/852,050

(22) Filed: Mar. 28, 2013

(65) Prior Publication Data

US 2014/0293687 A1    Oct. 2, 2014

(51) Int. Cl.
| | |
|---|---|
| H01L 29/06 | (2006.01) |
| H01L 45/00 | (2006.01) |
| B82Y 10/00 | (2011.01) |
| G11C 13/00 | (2006.01) |
| H01L 27/24 | (2006.01) |
| G11C 13/02 | (2006.01) |

(52) U.S. Cl.
CPC .................. *H01L 45/16* (2013.01); *B82Y 10/00* (2013.01); *G11C 13/003* (2013.01); *G11C 13/0004* (2013.01); *G11C 13/0069* (2013.01); *H01L 27/2463* (2013.01); *H01L 45/06* (2013.01); *H01L 45/126* (2013.01); *H01L 45/1233* (2013.01); *H01L 45/144* (2013.01); *H01L 45/1683* (2013.01); *G11C 13/004* (2013.01); *G11C 13/025* (2013.01); *G11C 2213/76* (2013.01)

(58) Field of Classification Search
CPC .. H01L 27/2481; H01L 45/1253; H01L 45/16
USPC .................................. 257/1–5; 365/148, 163
See application file for complete search history.

(56) References Cited

U.S. PATENT DOCUMENTS

| | | | |
|---|---|---|---|
| 7,749,801 B2 | 7/2010 | Choi et al. | |
| 2005/0127349 A1* | 6/2005 | Horak et al. | 257/3 |
| 2007/0012956 A1* | 1/2007 | Gutsche et al. | 257/246 |
| 2007/0292985 A1* | 12/2007 | Zhang | 438/95 |
| 2009/0014705 A1* | 1/2009 | Hsu et al. | 257/3 |
| 2009/0080236 A1 | 3/2009 | Nakamura | |
| 2010/0034016 A1* | 2/2010 | Liu | 365/163 |
| 2010/0072450 A1* | 3/2010 | Son | 257/4 |
| 2010/0237318 A1 | 9/2010 | Choi et al. | |
| 2011/0012081 A1* | 1/2011 | Yoon et al. | 257/2 |

OTHER PUBLICATIONS

Xiong et al., "Low-Power Switching of Phase-Change Materials with Carbon Nanotube Electrodes," Science Magazine, vol. 332, Apr. 29, 2011, pp. 568-570.

* cited by examiner

*Primary Examiner* — Cheung Lee
*Assistant Examiner* — Frederick B Hargrove
(74) *Attorney, Agent, or Firm* — Allen, Dyer, Doppelt, Milbrath & Gilchrist, P.A.

(57) ABSTRACT

A semiconductor device may include a substrate, and an array of PCM memory cells above the substrate. Each PCM memory cell may include first and second vertically aligned electrodes, a first dielectric layer between the first and second electrodes, a carbon nanotube extending vertically through the first dielectric layer from the second electrode and toward the first electrode, and a PCM body between the first electrode and the at least one carbon nanotube.

26 Claims, 9 Drawing Sheets

SEMICONDUCTOR DEVICE WITH PCM MEMORY CELLS AND NANOTUBES AND RELATED METHODS

TECHNICAL FIELD

The present disclosure relates to the field of electronic devices and, more particularly, to semiconductor devices and related methods.

BACKGROUND

Solid-state memory devices have become quite popular due to several advantages over typical active memory devices. First and foremost, the solid-state memory device comprises no moving parts, so it consumes less power and provides robust reliability. Moreover, solid-state memory devices are resistant to mechanical stress, such as impacts and vibration.

One type of memory used for solid-state memory devices is the flash memory device. The flash memory device may be based upon NAND or NOR logic gates, for example. For example, U.S. Patent Application Publication No. 2009/0080236 to Nakamura discloses a memory device. The memory device comprises a plurality of memory cells, and bit lines coupled to each memory cell. The memory device provides a supply voltage to each of the memory cells via the bit lines. Even though solid-state memory devices use less power than typical approaches, there is a desire to reduce the power consumption of solid-state memory devices.

Another approach to solid-state memory is a phase-change memory. These devices, rather than using the floating gate approach of flash memory, use chalcogenide glass for storing data. In particular, chalcogenide glass may be forced to take either amorphous or crystalline form by exposing it to a prescribed level of heat. The current state is detected by detecting the resistivity of the chalcogenide glass, which predictably varies based upon the form thereof.

A potential drawback to these phase-change memories is increased power consumption. In particular, the current required to phase-change the chalcogenide glass, i.e. program the memory cell, may be quite high, thereby increasing power demands. In typical approaches, the chalcogenide glass has been heated and cooled using a titanium nitride (TiN) heating element.

One approach to such a power consumption drawback is disclosed in "Low-Power Switching of Phase-Change Materials with Carbon Nanotube Electrodes," Pop et al., Science Magazine, Vol. 332, Apr. 29, 2011, the contents of which are hereby incorporated by reference in their entirety. This approach comprises forming a phase-change memory cell using carbon nanotubes as the electrodes. The carbon nanotubes extend horizontally on a substrate, reducing memory density.

SUMMARY

In view of the foregoing, it is an object of the present disclosure to provide a power efficient semiconductor memory device with phase-change material (PCM) memory cells.

This and other objects, features, and advantages are provided by a semiconductor device that may comprise a substrate, and an array of PCM memory cells above the substrate. Each PCM memory cell may comprise first and second vertically aligned electrodes, a first dielectric layer between the first and second electrodes, at least one carbon nanotube extending vertically through the first dielectric layer from the second electrode and toward the first electrode, and a PCM body between the first electrode and the at least one carbon nanotube. Advantageously, the PCM memory cells are efficiently programmed using the vertical carbon nanotubes. Also, the density of the PCM memory cells is also very high.

In some embodiments, the first electrode may be vertically above the second electrode. In other embodiments, the first electrode may be vertically below the second electrode. For example, the PCM body may comprise a chalcogenide.

Additionally, the semiconductor device may further comprise a blocking layer between the substrate and the first dielectric layer. The semiconductor device also may further comprise a first barrier layer surrounding the PCM body and the first electrode. The semiconductor device may further comprise a second barrier layer surrounding the second electrode.

Furthermore, the semiconductor device may further comprise a second dielectric layer below the first dielectric layer, and the first dielectric layer may have a lower dielectric constant than the second dielectric layer. In some embodiments, the semiconductor device may further comprise read/write circuitry coupled to the array of PCM memory cells.

Another aspect is directed to a method of making a semiconductor device. The method may include forming an array of PCM memory cells above a substrate so that each PCM memory cell comprises first and second vertically aligned electrodes, a first dielectric layer between the first and second electrodes, at least one carbon nanotube extending vertically through the first dielectric layer from the second electrode and toward the first electrode, and a PCM body between the first electrode and the at least one carbon nanotube.

DETAILED DESCRIPTION OF THE PREFERRED EMBODIMENTS

The present embodiments will now be described more fully hereinafter with reference to the accompanying drawings, in which preferred embodiments are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
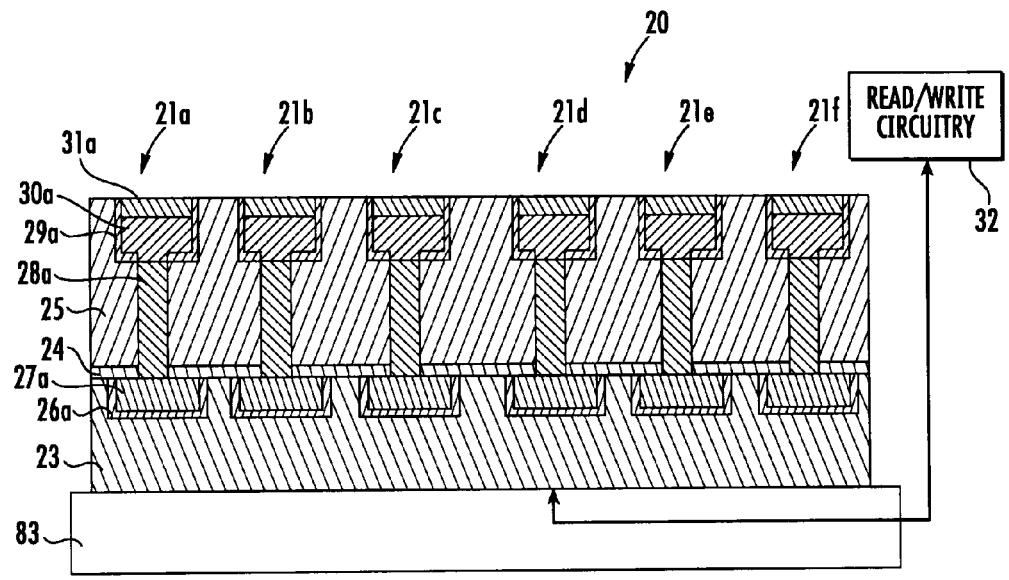
FIG. 1 is a schematic cross-sectional view of a semiconductor device according to the present disclosure.

Referring initially to FIG. 1, a semiconductor device 20 according to the present disclosure is now described. The semiconductor device 20 illustratively includes a substrate 83, and an array of PCM memory cells 21a-21f above the substrate. For example, the substrate 83 may comprise silicon with an appropriate dopant concentration (e.g. N/P type dopants). Each PCM memory cell 21a-21f comprises vertically aligned first electrodes 31a-31f and second electrodes 27a-27f. For example, the first electrodes 31a-31f and second electrodes 27a-27f may each comprise at least one of copper, tungsten, and aluminum.

Also, each PCM memory cell 21a-21f comprises a first dielectric layer 25 between the first 31a-31f and second 27a-27f electrodes, and at least one carbon nanotube 28a-28f extending vertically through the first dielectric layer from the second electrode and toward the first electrode, and a PCM body 30a-30f between the first electrode and the at least one carbon nanotube. For example, the first dielectric layer 25 may comprise an ultra low-k (ULK) dielectric material, such as $SiO_2$ doped with fluorine or carbon. For example, the PCM body 30a-30f may comprise a chalcogenide, such as $Ge_2Sb_2Te_5$.

The at least one carbon nanotube 28a-28f in each memory cell 21a-21f acts as a heating rod for changing the state of the PCM body 30a-30f, i.e. between amorphous and crystalline states. For example, during programming, a voltage is applied to the second electrode 27a-27f, which applies current through the at least one carbon nanotube 28a-28f and to the first electrode 31a-31f. The at least one carbon nanotube 28a-28f heats up and via conduction heats the PCM body 30a-30f, thereby effecting a phase change.

Advantageously, the phase-change memory cells 21a-21f are efficiently programmed using the vertical carbon nanotubes 28a-28f, i.e. with a reduced programming current. The may enable the semiconductor device 20 to operate at a reduced power level. Moreover, the semiconductor device 20 may be manufactured using complementary metal-oxide-semiconductor (CMOS) processes.

In some embodiments, each carbon nanotube 28a-28f may have an identical diameter. Advantageously, this provides for predictable heating performance for each PCM memory cell 21a-21f, i.e. the same applied current will accomplish the needed change in the respective PCM bodies 30a-30f. Moreover, as the CMOS processing resolution improves, the device can be reduced in size.

In this illustrated embodiment, the first electrode 31a-31f is vertically above the second electrode 27a-27f. In other embodiments (FIG. 2), this arrangement may be reversed. Additionally, the semiconductor device 20 illustratively includes a blocking layer 24 between the substrate 83 and the first dielectric layer 25. The blocking layer 24 may comprise an N-blocking layer, such as $SiCN_i$. Helpfully, the blocking layer 24 may reduce current leakage from the second electrode 27a-27f.

The semiconductor device 20 also further comprises a first barrier 29a-29f layer surrounding the PCM body 30a-30f and the first electrode 31a-31f. For example, the first barrier layer 29a-29f may comprise at least one of SiCNi, SiN, or some other N-blocking material. This first barrier layer 29a-29f may reduce heat transfer between each memory cell 21a-21f, reduce current leakage, and reduce diffusion.

The semiconductor device 20 further comprises a second barrier layer 26a-26f surrounding the second electrode 27a-27f. The second barrier layer 26a-26f may comprise, for example, TiN, TaN.

Furthermore, the semiconductor device 20 further comprises a second dielectric layer 23 below the first dielectric layer 25. For example, the second dielectric layer 23 may comprise silicon dioxide ($SiO_2$). The first dielectric layer 25 may have a lower dielectric constant than the second dielectric layer 23. In the illustrated embodiment, the semiconductor device 20 further comprises read/write circuitry 32 integrated on the substrate 83 and coupled to the array of PCM memory cells 21a-21f.

Figure 2:
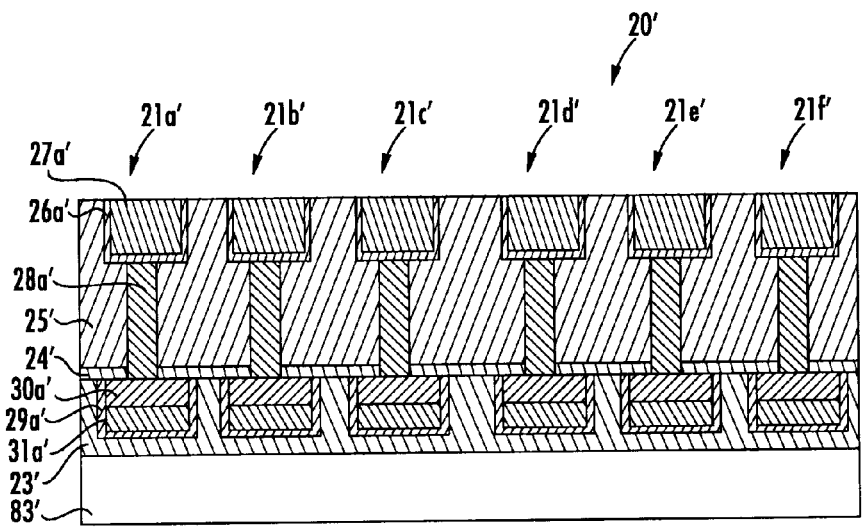
FIG. 2 is a schematic cross-sectional view of another embodiment of a semiconductor device according to the present disclosure.
Figure 3:
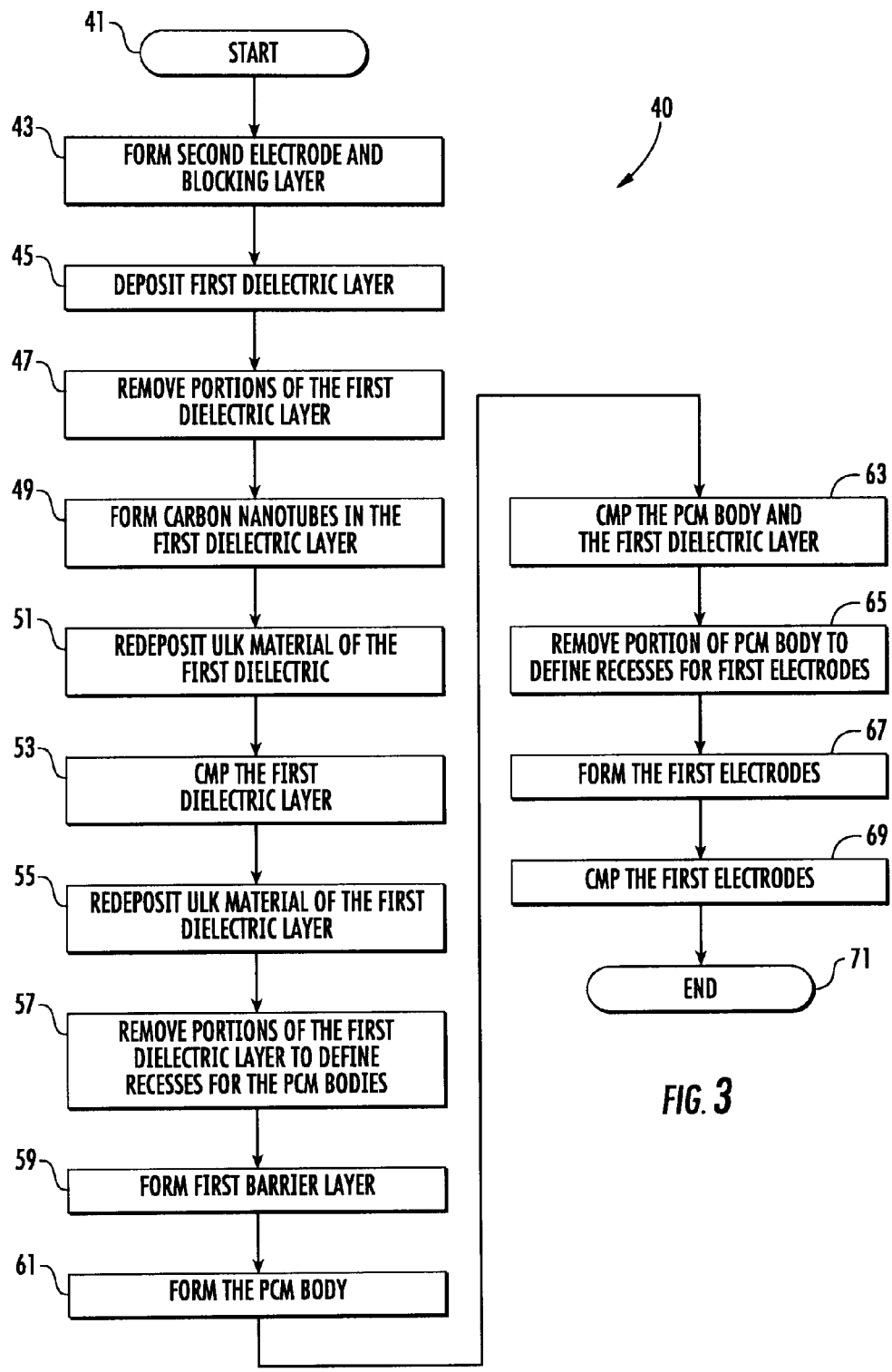
FIG. 3 is a flowchart of a method for making the semiconductor device of FIG. 1.

Referring now additionally to FIG. 2, another embodiment of the semiconductor device 20' is now described. In this embodiment of the semiconductor device 20', those elements already discussed above with respect to FIG. 1 are given prime notation and most require no further discussion herein. This embodiment differs from the previous embodiment in that this semiconductor device 20' has the first electrode 31a'-31f' being vertically below the second electrode 27a'-27f'.

Another aspect is directed to a method of making a semiconductor device 20. The method may include forming an array of PCM memory cells 21a-21f above a substrate 83. The method may also include forming each PCM memory cell 21a-21f to comprise first 31a-31f and second 27a-27f vertically aligned electrodes, a first dielectric layer 25 between the first and second electrodes, at least one carbon nanotube 28a-28f extending vertically through the first dielectric layer from the second electrode and toward the first electrode, and a PCM body 30a-30f between the first electrode and the at least one carbon nanotube.

Figure 4:
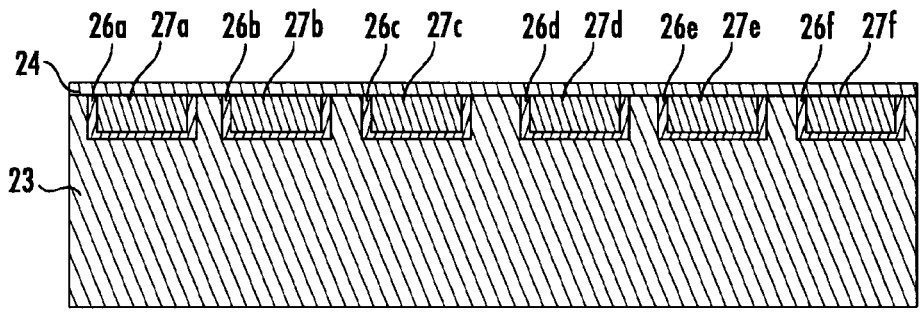
FIGS. 4-17 are schematic cross-sectional views of steps for making the semiconductor device of FIG. 1.

Referring now additionally to FIGS. 3-17, a flowchart 40 illustrates a method for making the semiconductor device 20 (Block 41). The method includes forming the second dielectric layer 23 on a substrate (not shown in these figures), and the second electrodes 27a-27f therein with respective second barrier layers 26a-26f. The method also includes forming a blocking layer 24, for example, comprising an N-block layer. (FIG. 4 and Block 43).

Figure 5:
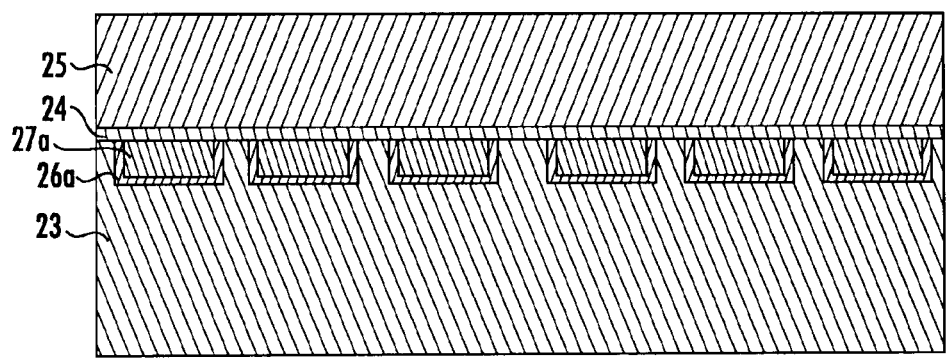
Figure 6:
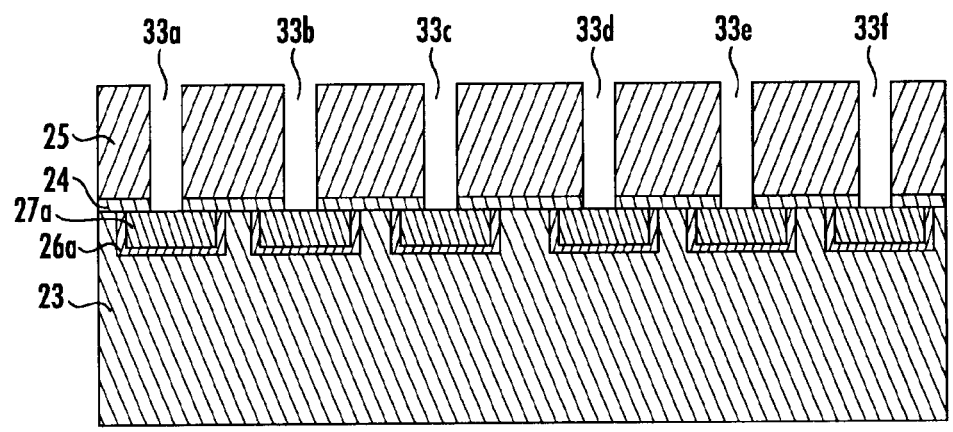

The method includes forming a first dielectric layer 25. For example, the first dielectric layer 25 may comprise an ULK dielectric material (FIG. 5 and Block 45). The method includes performing an etching operation (i.e. removing portions of the first dielectric layer) on the first dielectric layer 25 to form a plurality of columns 33a-33f therein (FIG. 6 and Block 47). For example, the etching operation may comprise a reactive-ion etching (RIE) operation.

Figure 7:
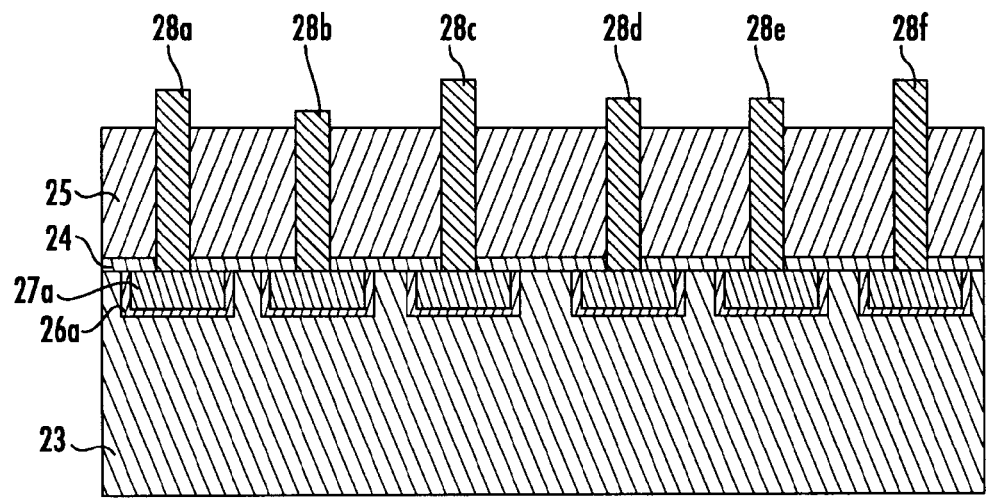
Figure 8:
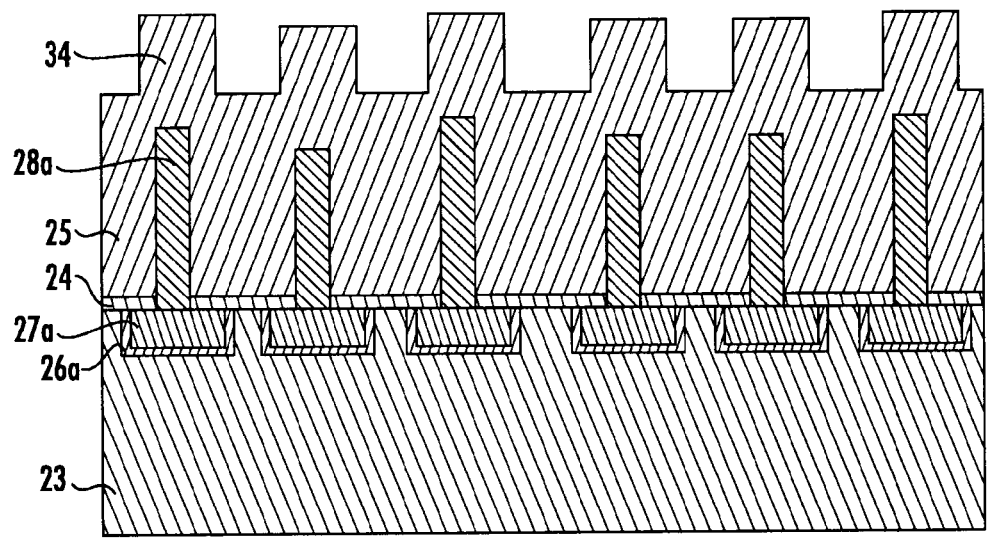
Figure 9:
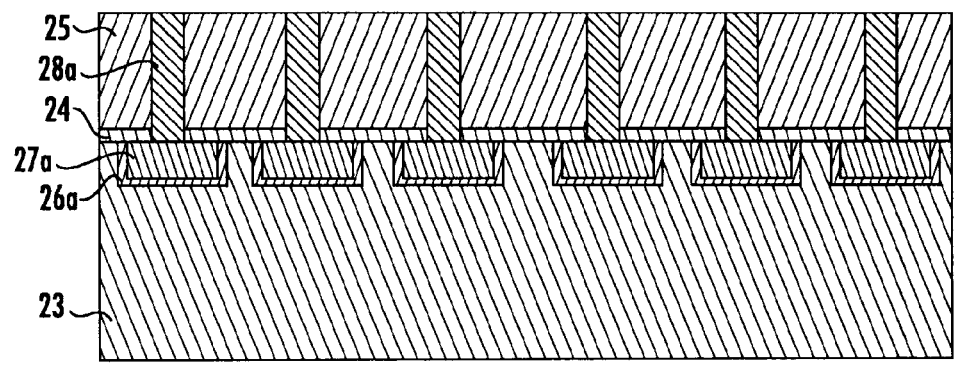
Figure 10:
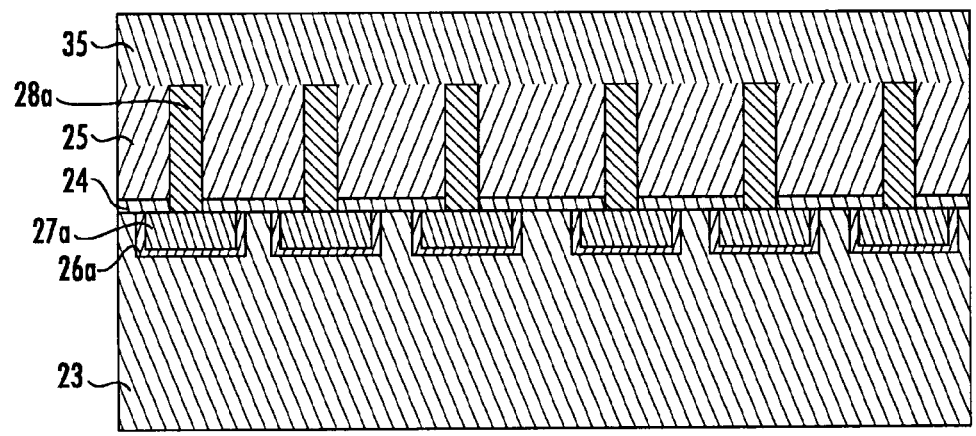

The method includes forming the plurality of carbon nanotubes 28a-28f in the plurality of columns 33a-33f (FIG. 7 and Block 49). As will be appreciated, each column 33a-33f may be filled with a plurality of carbon nanotubes 28a-28f. For example, the plurality of carbon nanotubes 28a-28f may be formed using the technique disclosed in Pop et al. The method also includes redepositing dielectric material 34 on the upper surface and an annealing step (FIG. 8 and Block 51). The dielectric material 34 may comprise the same ULK material as the first dielectric layer 25. In some embodiments, the annealing step may be omitted. The method then includes a polishing step, such as chemical mechanical polishing (CMP), to provide a flat upper surface (FIG. 9 and Block 53). Then again, the method includes redepositing dielectric material 35 (FIG. 10 and Block 55). The dielectric material 35 may comprise the same ULK material as the first dielectric layer 25.

Figure 11:
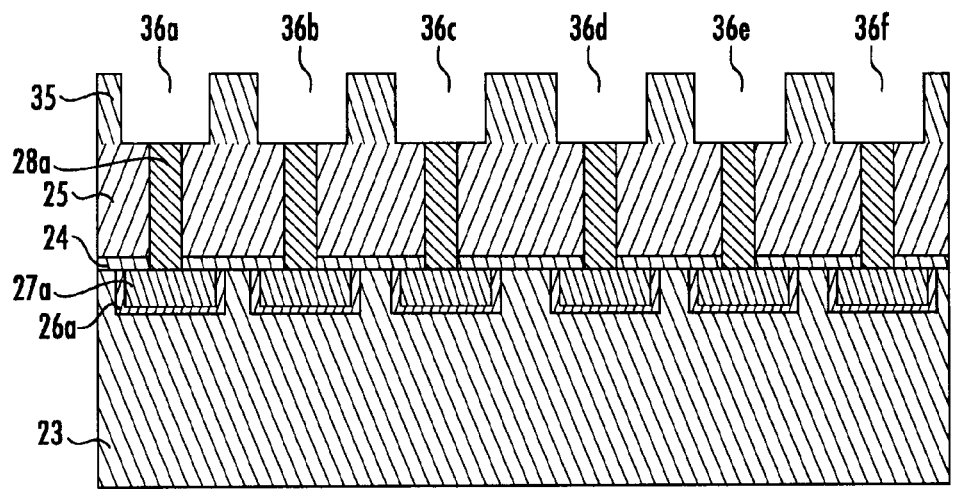
Figure 12:
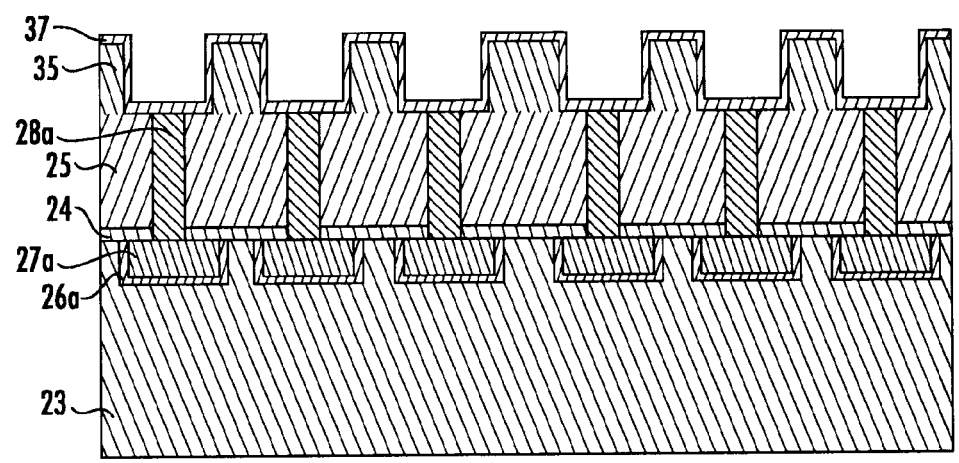

The method includes another etching operation to remove portions of the ULK material 35 to define recesses 36a-36f for forming the structure of the first electrodes 31a-31f (FIG. 11 and Block 57). The method includes forming a first barrier layer 37, which will define the first barrier layer 29a-29f in the finished memory cells 21a-21f (FIG. 12 and Block 59).

Figure 13:
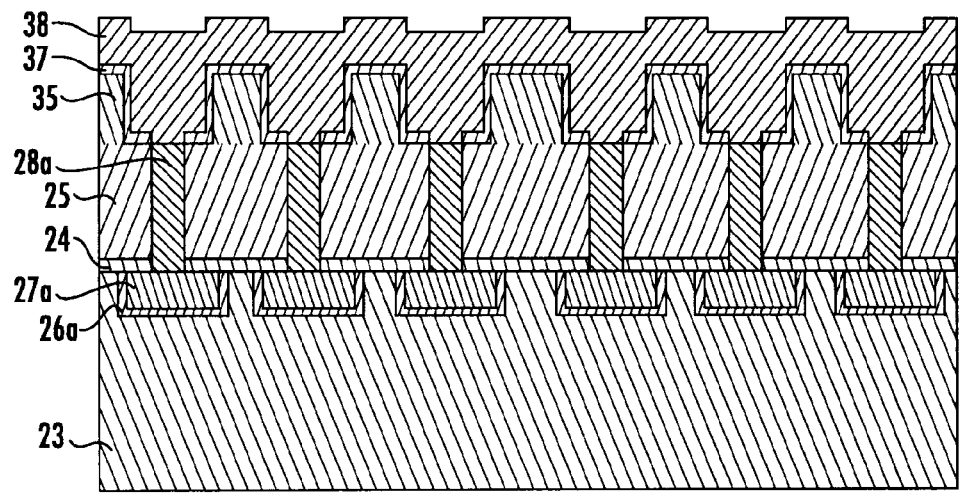
Figure 14:
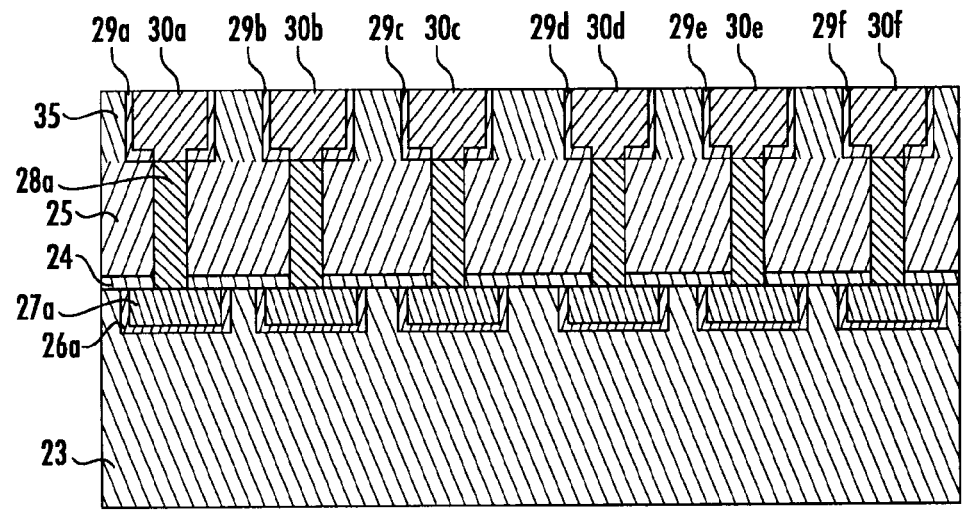
Figure 15:
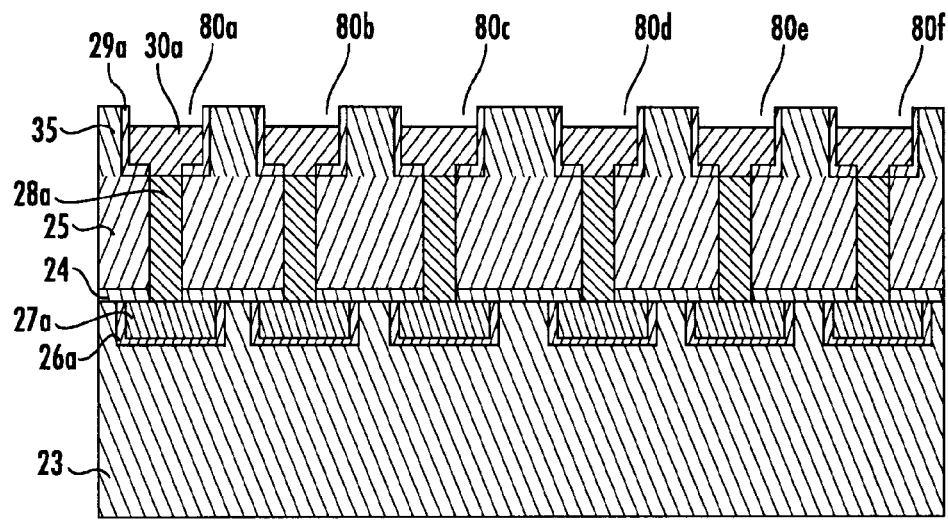

The method includes forming a PCM layer 38 on the upper surface and in the recesses 36a-36f, and yet another polishing step (FIGS. 13-14 and Blocks 61, 63). The method includes removing portions of the PCM layer 38 to define recesses 80a-80f for the first electrodes 31a-31f (FIG. 15 and Block 65).

The method includes forming an electrically conductive material layer 81 on the upper surface and the recesses 80a-

Figure 16:
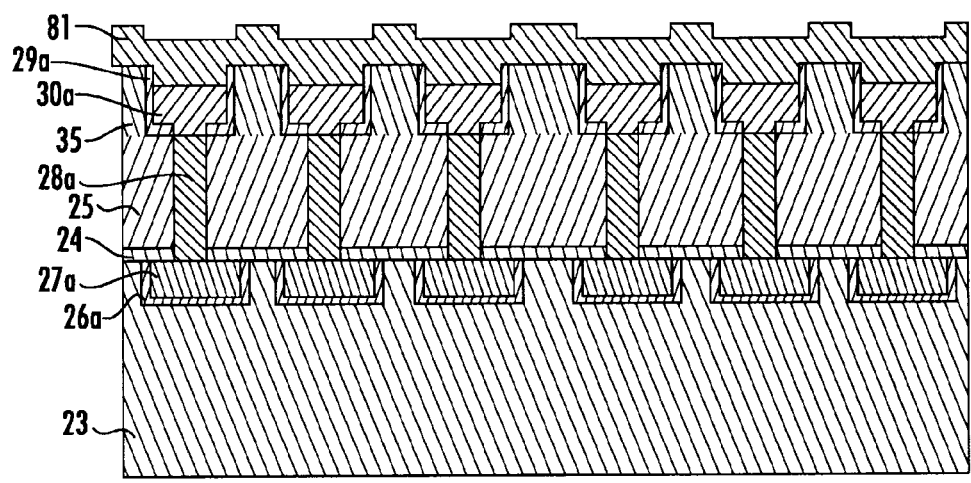
Figure 17:
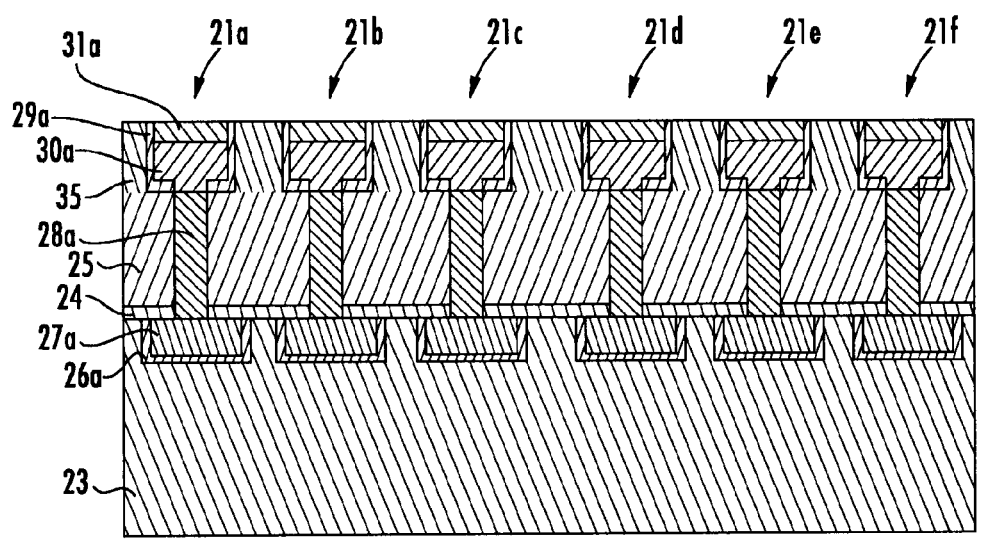

80f (FIG. 16 and Block 67). The method includes another polishing step to define the first electrodes 31a-31f (FIG. 17 and Blocks 69, 71).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A semiconductor device comprising:
   a substrate; and
   an array of phase-change material (PCM) memory cells above said substrate, each PCM memory cell comprising
      first and second vertically aligned electrodes,
      a first dielectric layer between said first and second electrodes,
      at least one carbon nanotube extending vertically through said first dielectric layer from said second electrode and toward said first electrode,
      a PCM body between said first electrode and said at least one carbon nanotube, and
      a first barrier layer surrounding said PCM body and said first electrode and defining an opening for receiving said at least one carbon nanotube, the opening having peripheral edges being flush with said at least one carbon nanotube,
      said first electrode and said PCM body being in said first dielectric layer,
      said first barrier layer being between said first dielectric layer and said PCM body.

2. The semiconductor device of claim 1 wherein said first electrode is vertically above said second electrode.

3. The semiconductor device of claim 1 wherein said first electrode is vertically below said second electrode.

4. The semiconductor device of claim 1 wherein said PCM body comprises a chalcogenide.

5. The semiconductor device of claim 1 further comprising a second barrier layer surrounding said second electrode.

6. The semiconductor device of claim 1 further comprising a second dielectric layer below said first dielectric layer; and wherein said first dielectric layer has a lower dielectric constant than said second dielectric layer.

7. The semiconductor device of claim 1 further comprising read/write circuitry coupled to said array of PCM memory cells.

8. A semiconductor device comprising:
   a substrate;
   an array of phase-change material (PCM) memory cells above said substrate, each PCM memory cell comprising
      first and second vertically aligned electrodes,
      a first dielectric layer between said first and second electrodes,
      at least one carbon nanotube extending vertically through said first dielectric layer from said second electrode and toward said first electrode,
      a PCM body between said first electrode and said at least one carbon nanotube,
      a first barrier layer surrounding said PCM body and said first electrode and defining an opening for receiving said at least one carbon nanotube, the opening having peripheral edges being flush with said at least one carbon nanotube, and
      a second barrier layer surrounding said second electrode,
      said first electrode, and said PCM body being in said first dielectric layer,
      said first barrier layer being between said first dielectric layer and said PCM body; and
   read/write circuitry coupled to said array of PCM memory cells.

9. The semiconductor device of claim 8 wherein said first electrode is vertically above said second electrode.

10. The semiconductor device of claim 8 wherein said first electrode is vertically below said second electrode.

11. The semiconductor device of claim 8 wherein said PCM body comprises a chalcogenide.

12. The semiconductor device of claim 8 further comprising a second dielectric layer below said first dielectric layer; and wherein said first dielectric layer has a lower dielectric constant than said second dielectric layer.

13. A method of making a semiconductor device comprising:
   forming an array of phase-change material (PCM) memory cells above a substrate so that each PCM memory cell comprises
      first and second vertically aligned electrodes,
      a first dielectric layer between the first and second electrodes,
      at least one carbon nanotube extending vertically through the first dielectric layer from the second electrode and toward the first electrode, and
      a PCM body between the first electrode and the at least one carbon nanotube, the first electrode and the PCM body being in the first dielectric layer; and
   forming a first barrier layer surrounding the PCM body and the first electrode, the first barrier layer defining an opening for receiving the at least one carbon nanotube, the opening having peripheral edges being flush with said at least one carbon nanotube, the first barrier layer being between the first dielectric layer and the PCM body.

14. The method of claim 13 wherein the first electrode is vertically above the second electrode.

15. The method of claim 13 wherein the first electrode is vertically below the second electrode.

16. The method of claim 13 wherein the PCM body comprises a chalcogenide.

17. The method of claim 13 further comprising forming a second barrier layer surrounding the second electrode.

18. The method of claim 13 further comprising forming a second dielectric layer below the first dielectric layer; and wherein the first dielectric layer has a lower dielectric constant than the second dielectric layer.

19. A semiconductor device comprising:
   a substrate; and
   an array of phase-change material (PCM) memory cells above said substrate, each PCM memory cell comprising
      first and second vertically aligned electrodes,
      a first dielectric layer between said first and second electrodes,
      a second dielectric layer below said first dielectric layer,
      at least one carbon nanotube extending vertically through said first dielectric layer from said second electrode and toward said first electrode,
      a PCM body between said first electrode and said at least one carbon nanotube,
      a blocking layer between said substrate and said first dielectric layer and defining an opening for receiving the at least one carbon nanotube, the opening having peripheral edges abutting said at least one carbon nanotube, and
a first barrier layer surrounding said PCM body and said first electrode;
said first electrode and said PCM body being in said second dielectric layer,
said first barrier layer being between said second dielectric layer and said PCM body.

20. The semiconductor device of claim 19 wherein said first electrode is vertically above said second electrode.

21. The semiconductor device of claim 19 wherein said first electrode is vertically below said second electrode.

22. The semiconductor device of claim 19 wherein said PCM body comprises a chalcogenide.

23. A method of making a semiconductor device comprising:
forming an array of phase-change material (PCM) memory cells above a substrate so that each PCM memory cell comprises
first and second vertically aligned electrodes,
a first dielectric layer between the first and second electrodes,
a second dielectric layer below the first dielectric layer,
at least one carbon nanotube extending vertically through the first dielectric layer from the second electrode and toward the first electrode,
a PCM body between the first electrode and the at least one carbon nanotube, the first electrode and the PCM body being in the second dielectric layer, and
a first barrier layer surrounding the PCM body and the first electrode and being between the second dielectric layer and the PCM body; and
forming a blocking layer between the substrate and the first dielectric layer, the blocking layer defining an opening for receiving the at least one carbon nanotube, the opening having peripheral edges abutting the at least one carbon nanotube.

24. The method of claim 23 wherein the first electrode is vertically above the second electrode.

25. The method of claim 23 wherein the first electrode is vertically below the second electrode.

26. The method of claim 23 wherein the PCM body comprises a chalcogenide.

\* \* \* \* \*